(12) United States Patent
Huang et al.

(10) Patent No.: US 11,251,213 B2
(45) Date of Patent: Feb. 15, 2022

(54) CONCAVE REFLECTOR FOR COMPLEMENTARY METAL OXIDE SEMICONDUCTOR IMAGE SENSOR (CIS)

(71) Applicant: Taiwan Semiconductor Manufacturing Co., Ltd., Hsin-Chu (TW)

(72) Inventors: Po-Han Huang, Tainan (TW); Jiech-Fun Lu, Madou Township (TW); Yu-Chun Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/063,801

(22) Filed: Oct. 6, 2020

(65) Prior Publication Data

US 2021/0036043 A1    Feb. 4, 2021

Related U.S. Application Data

(60) Continuation of application No. 16/851,265, filed on Apr. 17, 2020, now Pat. No. 10,833,115, which is a
(Continued)

(51) Int. Cl.
*H01L 27/146* (2006.01)

(52) U.S. Cl.
CPC .... *H01L 27/14629* (2013.01); *H01L 27/1463* (2013.01); *H01L 27/1464* (2013.01);
(Continued)

(58) Field of Classification Search
CPC ................................................ H01L 27/14629
(Continued)

(56) References Cited

U.S. PATENT DOCUMENTS 6,441,373 B1    8/2002  Masalkar
7,615,808 B2   11/2009  Pain et al.
(Continued)

FOREIGN PATENT DOCUMENTS

EP          0987767 A2    3/2000

OTHER PUBLICATIONS

Non-Final Office Action dated Jan. 31, 2020 in connection with U.S. Appl. No. 16/121,958.
(Continued)

*Primary Examiner* — Ajay Arora
(74) *Attorney, Agent, or Firm* — Eschweiler & Potashnik, LLC

(57) ABSTRACT

In some embodiments, the present disclosure relates to an integrated chip having an inter-layer dielectric (ILD) structure along a first surface of a substrate having a photodetector. An etch stop layer is over the ILD structure, and a reflector is surrounded by the etch stop layer and the ILD structure. The reflector has a curved surface facing the substrate at a location directly over the photodetector. The curved surface is coupled between a first sidewall and a second sidewall of the reflector. The reflector has larger thicknesses along the first sidewall and the second sidewall than at a center of the reflector between the first sidewall and the second sidewall.

20 Claims, 10 Drawing Sheets

Related U.S. Application Data division of application No. 15/935,341, filed on Mar. 26, 2018, now Pat. No. 10,680,024.

(60) Provisional application No. 62/546,889, filed on Aug. 17, 2017.

(52) U.S. Cl.
CPC .. H01L 27/14614 (2013.01); H01L 27/14627 (2013.01); H01L 27/14685 (2013.01); H01L 27/14689 (2013.01); H01L 27/1461 (2013.01); H01L 27/14621 (2013.01); H01L 27/14636 (2013.01); H01L 27/14645 (2013.01)

(58) Field of Classification Search
USPC .......................................................... 257/292
See application file for complete search history.

(56) References Cited

U.S. PATENT DOCUMENTS

| | | |
|---|---|---|
| 9,761,623 B2 | 9/2017 | Lee |
| 2002/0063267 A1 | 5/2002 | Kumagai et al. |
| 2009/0194671 A1 | 8/2009 | Nozaki et al. |
| 2009/0200586 A1 | 8/2009 | Mao et al. |
| 2011/0049330 A1 | 3/2011 | Adkisson et al. |
| 2011/0215342 A1 | 9/2011 | Oliver |
| 2015/0279886 A1* | 10/2015 | Liao .................. H01L 27/14629 438/70 |
| 2016/0043125 A1 | 2/2016 | Hatano |
| 2016/0307940 A1* | 10/2016 | Cheng .............. H01L 27/14629 |
| 2017/0236854 A1 | 8/2017 | Lee et al. |
| 2020/0075657 A1 | 3/2020 | Huang et al. |

OTHER PUBLICATIONS

Non-Final Office Action dated Aug. 29, 2019 in connection with U.S. Appl. No. 15/935,341.

Notice of Allowance dated Jan. 30, 2020 in connection with U.S. Appl. No. 15/935,341.

Notice of Allowance dated Jul. 1, 2020 for U.S. Appl. No. 16/851,265.

* cited by examiner

CONCAVE REFLECTOR FOR COMPLEMENTARY METAL OXIDE SEMICONDUCTOR IMAGE SENSOR (CIS)

REFERENCE TO RELATED APPLICATIONS

This application is a Continuation of U.S. application Ser. No. 16/851,265, filed on Apr. 17, 2020, which is a Divisional of U.S. application Ser. No. 15/935,341, filed on Mar. 26, 2018 (now U.S. Pat. No. 10,680,024, issued on Jun. 9, 2020), which claims the benefit of U.S. Provisional Application No. 62/546,889, filed on Aug. 17, 2017. The contents of the above-referenced Patent Applications are hereby incorporated by reference in their entirety.

BACKGROUND

Many modern day electronic devices comprise image sensors that convert optical images to digital data representing the optical images. One type of image sensor commonly used in electronic devices is a backside illumination (BSI) image sensor. A BSI image sensor comprises an array of photodetectors overlying an interconnect structure and configured to receive radiation on an opposite side from the interconnect structure. This arrangement allows radiation to impinge on the photodetectors unobstructed by conductive features in the interconnect structure, such that the BSI image sensor has high sensitivity to incident radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
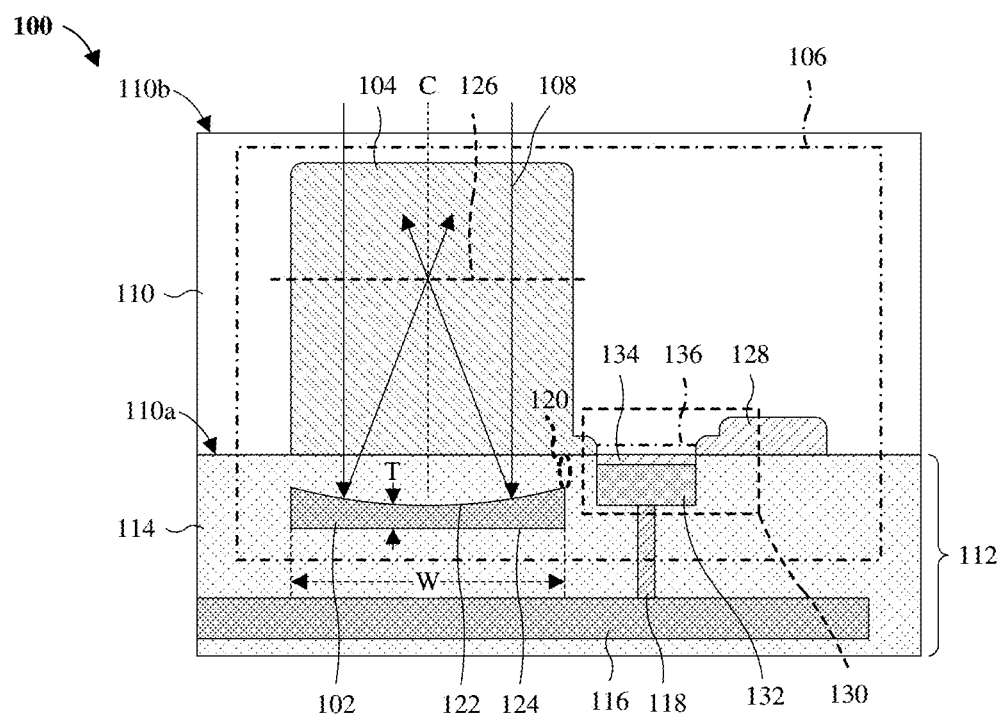
FIG. 1 illustrates a cross-sectional view of some embodiments of a backside illuminated (BSI) image sensor with a reflector having a curved surface.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, backside illuminated (BSI) image sensors comprise an array of photodetectors arranged within a substrate. An interconnect structure is arranged along a first side of the substrate. The interconnect structure comprises a plurality of conductive interconnect features surrounded by a dielectric structure having one or more inter-level dielectric layers. The array of photodetectors are configured to receive radiation (e.g., photons) from a second side of the substrate opposite the first side. Because the substrate receives radiation on a side not covered by the interconnect structure, paths of radiation incident on BSI image sensors are not obstructed by the interconnect structure and thus the BSI image sensors are able to provide for a good quantum efficiency.

To further increase a quantum efficiency of a BSI image sensor, planar conductive features may be formed within the interconnect structure at a location underlying the array of photodetectors. The planar conductive features are configured to increase the quantum efficiency of the photodetectors by reflecting radiation that passes through the photodetector back to the photodetector, thereby providing the photodetectors with two opportunities to absorb the radiation. However, since incident radiation travels along substantially straight lines, angled radiation may diverge away from an overlying photodetector due to a gap between the photodetector and an underlying planar conductive feature. For example, radiation with a low angle of incidence may strike a planar conductive feature and diverge through a gap to neighboring pixel sensors and induce crosstalk.

The present application, in some embodiments, relates to a back-side illuminated complementary metal oxide semiconductor image sensor (BSI-CIS) having a curved reflector configured to provide for a high quantum efficiency and low crosstalk, and an associated method of formation. In some embodiments, the BSI-CIS comprises a photodetector disposed within a substrate. An interconnect structure is arranged within a dielectric structure arranged along a first side of the substrate. The interconnect structure comprises a contact via extending from an interconnect wire layer to a transistor coupled to the photodetector. A concave reflector is arranged within the dielectric structure. The concave reflector has a curved profile with edges that are closer to the substrate than a center. The curved profile is configured to reflect incident radiation towards a focal point that is within or above the photodetector, and thereby prevents the incident radiation from reflecting to adjacent photodetectors.

With reference to FIG. 1, a cross-sectional view of some embodiments of an integrated chip having a complementary metal oxide semiconductor image sensor (CIS) 100 including a reflector 102 is provided. Here, the CIS 100 is shown as a backside illuminated (BSI) image sensor. As illustrated, the reflector 102 is arranged under a photodetector 104 disposed in a substrate 110. In some embodiments, the photodetector 104 may comprise a photodiode of a pixel sensor 106. The photodetector 104 is configured to absorb radiation 108 impinging thereon. In some embodiments, the radiation 108 passes through the photodetector 104 and contacts the reflector 102. The reflector 102 comprises a reflective material, such as a metal. The reflector 102 is configured to reflect the radiation 108 that passes through the photodetector 104 back to the photodetector 104.

The substrate 110 has a first surface 110a and a second surface 110b. The radiation 108 enters the second surface 110b to reach the photodetector 104. In the some embodiments, the photodetector 104 extends into the substrate 110 from the first surface 110a. An interconnect structure 112 is arranged along the first surface 110a of the substrate 110. The interconnect structure 112 includes a dielectric structure 114 surrounding a conductive interconnect wire 116, a conductive contact 118, and the reflector 102. The conductive interconnect wire 116 is electrically coupled to the pixel sensor 106 by the conductive contact 118. The reflector 102 is separated from the second surface 110b of the substrate 110 by a gap 120.

The reflector 102 has an upper surface 122 facing the substrate 110. The upper surface 122 is concave. In some embodiments, the upper surface 122 is defined by a continuous function (i.e., a function differentiable at each point along the upper surface 122). In other embodiments, the upper surface 122 is defined by a non-continuous function (i.e., a function not differentiable at each point along the upper surface 122). The reflector 102 may also have a lower surface 124 that is substantially planar. The upper surface 122 and the lower surface 124 extend laterally between opposing sides of the photodetector 104 and, in some embodiments, have a same footprint. The footprint is a two-dimensional projection of the upper surface 122 or the lower surface 124 onto a horizontal plane.

In some embodiments, the reflector 102 is substantially symmetrical about a central axis C that is arranged at a midpoint of a width W of the reflector 102. Further, in some embodiments, a thickness T of the reflector 102 increases from the central axis C moving laterally toward an edge of the reflector 102. In some embodiments, the thickness T of the reflector 102 may monotonically increase from the central axis C toward an edge of the reflector 102.

By arranging the reflector 102 directly under the photodetector 104, radiation 108 passing through the photodetector 104 may be reflected back to the photodetector 104. Further, by configuring the upper surface 122 of the reflector 102 with a concave profile, the radiation 108 is focused to a focal point that is within or directly above the photodetector 104, thereby preventing radiation from diverging away from the photodetector 104 due to the gap 120. For example, the concave profile of the reflector 102 will reflect radiation 108 impinging the reflector 102 at a small angle of incidence back towards the photodetector 104, thereby reducing the amount of radiation able to escape through the gap 120. In some embodiments, the focal point may be at the intersection of the central axis C and a focal plane 126 extending laterally through the photodetector 104.

In some embodiments, the pixel sensor 106 further comprises a floating diffusion node (FDN) 128 and a transfer transistor 130. The FDN 128 is configured to store charge transferred thereto from the photodetector 104, and the transfer transistor 130 is configured to selectively transfer the charge to the FDN 128. The FDN 128 is arranged in the substrate 110. The FDN 128 includes a doped semiconductor region of opposite doping type as a surrounding region of the substrate 110. The transfer transistor 130 comprises a gate electrode 132 arranged on the substrate 110, laterally adjacent to the photodetector 104, and spaced from the substrate 110 by a gate dielectric layer 134. Further, the transfer transistor 130 comprises source/drain regions arranged in the substrate 110, respectively on opposing sides of the gate electrode 132, to define a channel region 136 over the gate electrode 132. In some embodiments, one of the source/drain regions is the photodetector 104, and/or one of the source/drain regions is the FDN 128. In some embodiments, the conductive contact 118 extends to the gate electrode 132 of the transfer transistor 130.

With reference to FIGS. 2A-2D, cross-sectional views 200A-200D of some alternative embodiments of the reflector 102 of FIG. 1 are provided. As illustrated by the cross-sectional view 200A of FIG. 2A, the reflector 102 may comprise a first segment 202 and a second segment 204 arranged along a photodetector 104 (e.g., a photodiode). In some embodiments, the first segment 202 may be separated from the second segment 204 by the dielectric structure 114. In other embodiments (not shown), the reflector 102 is continuous between the first segment 202 and the second segment 204. The first segment 202 and the second segment 204 may comprise for example, copper, titanium, chromium, niobium, lead, palladium, gold, silver, aluminum, aluminum copper, tungsten, or some other reflective material. In some embodiments, the first segment 202 and the second segment 204 may comprise different materials. In other embodiments, the first segment 202 and the second segment 204 may comprise a same material.

The first segment 202 is arranged under the photodetector 104 in the interconnect structure 112. In some embodiments, the first segment 202 extends laterally from a first side of the photodetector 104, towards a second side of the photodetector 104 that opposes the first side. In some embodiments, the first segment 202 has an upper surface 122 that is concave and a lower surface 124 that is planar. The second segment 204 has a first side 206 that is proximate to the photodetector 104 and a second side 208 that is opposite the first side 206. An isolation region 210 extends into the substrate 110 from the second surface 110b of the substrate 110. The second segment 204 is arranged over or adjacent to the first segment 202, within the isolation region 210.

By arranging the first segment 202 under the photodetector 104, radiation 108 passing through the photodetector 104 may be reflected back to the photodetector 104. Further, by arranging the second segment 204 laterally adjacent to the photodetector 104, the radiation 108 may be prevented from reflecting towards a neighboring pixel sensor (not shown). For example, radiation 108 reflecting off the first segment 202 towards the neighboring pixel sensor (not shown), will subsequently be reflected off the second segment 204 back towards the photodetector 104.

Figure 2A:
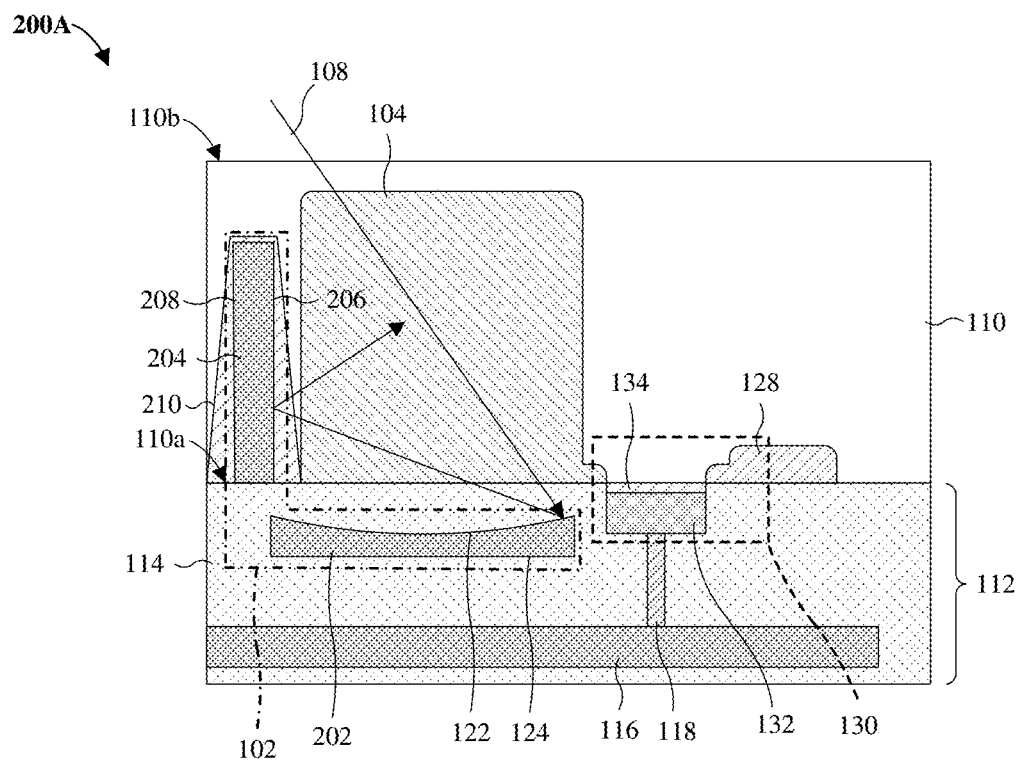
FIGS. 2A-2D illustrates cross-sectional views of some alternative embodiments of the reflector of FIG. 1.
Figure 2B:
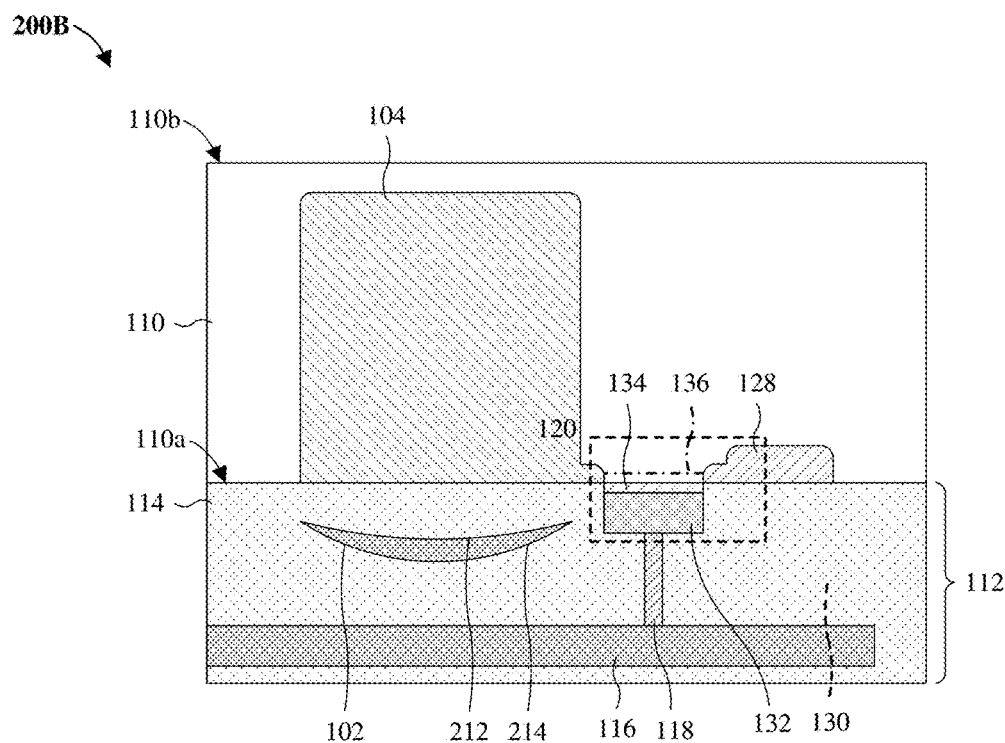

As illustrated by the cross-sectional view 200B of FIG. 2B, the reflector 102 may have an upper surface 212 that is concave and a lower surface 214 that is convex. The upper surface 212 and the lower surface 214 extend laterally between opposing sides of a photodetector 104 and, in some embodiments, have the same footprint.

Figure 2C:
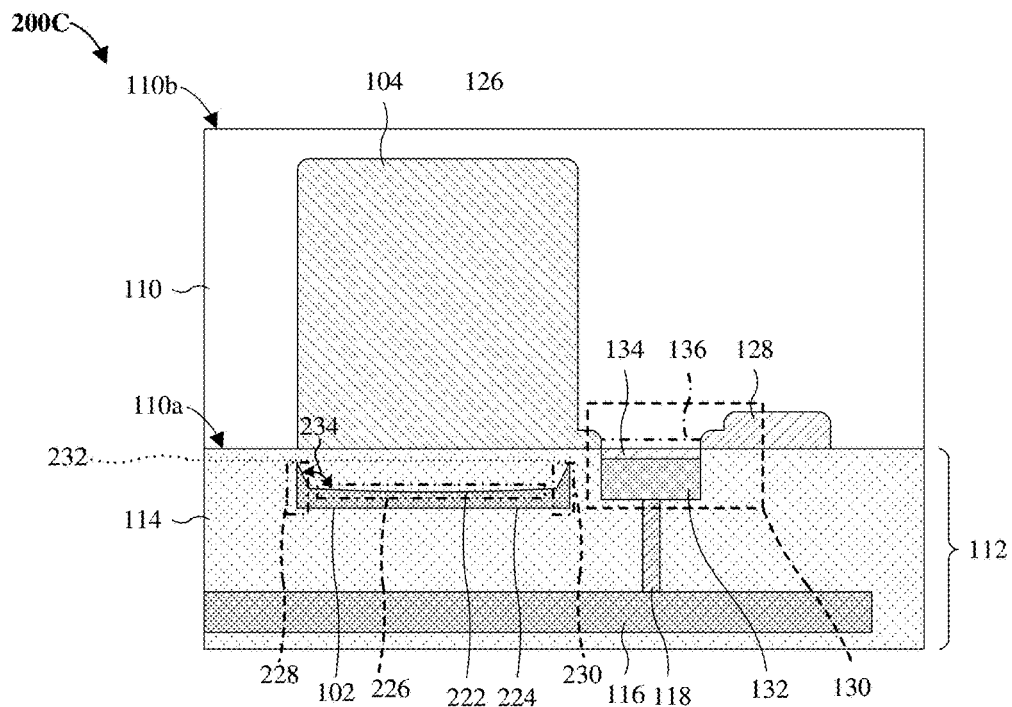

As illustrated by the cross-sectional view 200C of FIG. 2C, the reflector 102 may have an upper surface 222 opposing a lower surface 224 that is planar. The upper surface 222 has a central region 226 that is bounded by a first protrusion 228 on the first side and a second protrusion 230 on the second side. The central region 226 has a first curvature with a slope that is smaller than a slope of sidewalls of the first protrusion 228 and the second protrusion 230 that face each other. In some embodiments, the central region 226 may have a curved surface extending from the first protrusion 228 to the second protrusion 230. In other embodiments, the central region 226 may have a generally planar surface extending from the first protrusion 228 to the second protrusion 230. The first protrusion 228 and the second protrusion 230 may extend vertically upward at a protrusion angle 234 relative to the central region 226. The protrusion angle 234 may be an obtuse angle in a range of between approximately 100° and approximately 125°. In some embodiments, the first protrusion 228 and the second protrusion 230 come to points at apexes extending along a horizontal plane 232 over the upper surface 222 of the reflector 102.

Figure 2D:
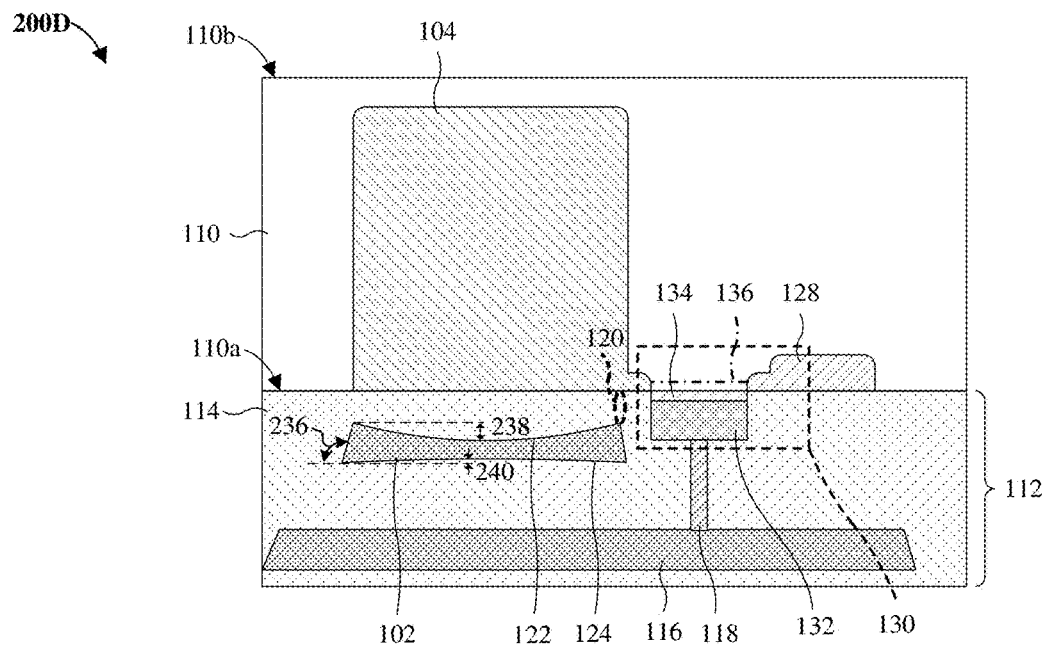

As illustrated by the cross-sectional view 200D of FIG. 2D, the reflector 102 may have outer sidewalls with an outer sidewall angle 236 relative to the planar bottom surface 124 of the reflector 102. The outer sidewall angle 236 may be an angle in a range of between approximately 60° and approximately 85°. In some embodiments, the outer sidewalls of the reflector 102 are angled so a lower surface 124 of the reflector 102 facing away from the substrate 110 has a larger width than an upper surface 122 of the reflector 102 facing the substrate 110.

In some embodiments, both the upper surface 122 of the reflector 102 and lower surface 124 of the reflector 102 may comprise concave surfaces. In some such embodiments, the upper surface 122 of the reflector 102 may have a first curvature defined by a first change in vertical position 238 between an outer edge and a center of the reflector 102, and the lower surface 124 of the reflector 102 may have a second curvature defined by a second change in vertical position 240 between an outer edge and a center of the reflector 102. In some embodiments, the first change in vertical position 238 is larger than the second change in vertical position 240.

Figure 3:
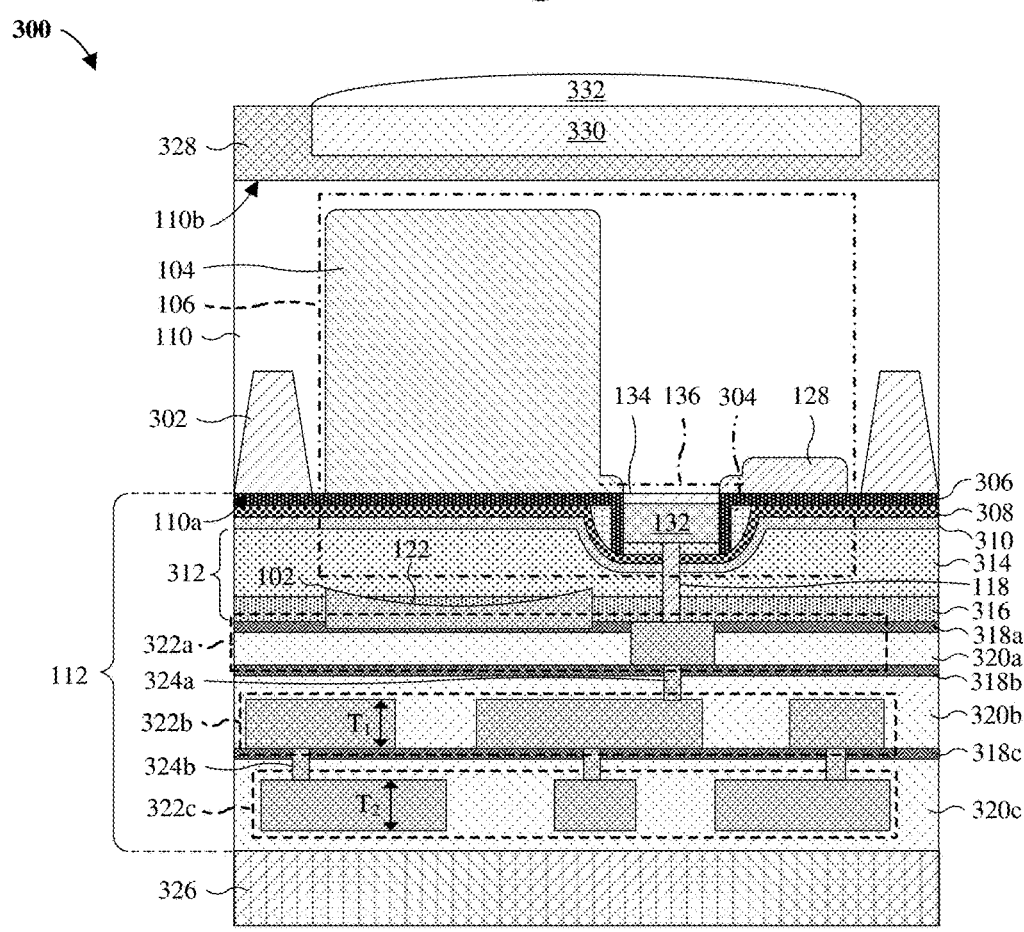
FIG. 3 illustrates a cross-sectional view of more detailed embodiments of the BSI image sensor of FIG. 1.

With reference to FIG. 3, a cross-sectional view of some more detailed embodiments of the BSI image sensor 300 of FIG. 1 is provided. As illustrated, isolation regions 302 are arranged within a first surface 110a of the substrate 110. The isolation regions 302 are arranged on opposing sides of a pixel sensor 106. The isolation regions 302 are configured to electrically and/or to optically isolate the pixel sensor 106 from a neighboring pixel sensor (not shown). The isolation regions 302 may be, for example, a shallow trench isolation (STI) region, an implant isolation region, and/or a deep trench isolation (DTI) region.

The pixel sensor 106 comprises a photodetector 104 and a transistor gate stack. In some embodiments, the transistor gate stack is disposed between the photodetector 104 and a FDN 128. The photodetector 104 and the FDN 128 are arranged in the substrate 110, and are doped semiconductor regions of opposite doping type (n-type or p-type) as respective regions of the substrate 110 that surround the doped semiconductor regions. The photodetector 104 is configured to generate and store charge in response to incident radiation, and the FDN 128 is configured to store charge transferred thereto from the photodetector 104. In some embodiments, the photodetector 104 and/or the FDN 128 have lateral extensions of reduced depth and/or concentration as respective bulks of the photodetector 104 (e.g., photodetector) and/or the FDN 128.

The transfer transistor 130 is configured to transfer charge accumulated in the photodetector 104 to the FDN 128. The transfer transistor 130 comprises a gate electrode 132 arranged on the substrate 110, laterally adjacent to the photodetector 104. The gate electrode 132 is spaced from the substrate 110 by a gate dielectric layer 134 and, in some embodiments, has sidewall surfaces lined by a sidewall spacer 304. The gate electrode 132 may be, for example, metal, doped polysilicon, or some other conductive material. The gate dielectric layer 134 may be, for example, silicon dioxide, a high κ dielectric (i.e., a dielectric with a dielectric constant κ exceeding about 3.9), or some other dielectric material. The sidewall spacer 304 may be, for example, silicon nitride, silicon oxynitride, or some other dielectric material.

The transfer transistor 130 further comprises source/drain regions arranged in the substrate 110, respectively on opposing sides of the gate electrode 132, to define a channel region 136 over the gate electrode 132 that selectively conducts depending upon a bias applied to the gate electrode 132. The source/drain regions are doped semiconductor regions of opposite doping type as respective regions of the substrate 110 that surround the doped semiconductor regions. In some embodiments, one of the source/drain regions is the photodetector 104, and/or one of the source/drain regions is the FDN 128.

An interconnect structure 112 is arranged along the first surface 110a of the substrate 110. The interconnect structure 112 comprises an inter-layer dielectric (ILD) structure 312. In some embodiments, the ILD structure 312 comprises a first ILD layer 314 and a second ILD layer 316 directly contacting a horizontally extending surface of the first ILD layer 314. In some embodiments, the ILD structure 312 may be separated from the substrate 110 by one or more of a TEOS (tetraethyl orthosilicate) layer 306, a resist protective oxide (RPO) layer 308, and/or a contact etch stop layer 310. The interconnect structure 112 further comprises alternating layers of etch stop layers (ESLs) 318a-318c and inter-metal dielectric (IMD) layers 320a-320c separated from the substrate 110 by the ILD structure 312. In some embodiments, the IMD layers 320a-320c may be, for example, silicon dioxide, a low κ dielectric (i.e., a dielectric with a dielectric constant κ less than about 3.9), phosphosilicate glass (PSG), some other dielectric, or a combination of the foregoing. In some embodiments, the ESLs 318a-318c may comprise a nitride, a carbide, or the like.

A plurality of conductive interconnect layers are arranged within the interconnect structure 112. The plurality of conductive interconnect layers comprise alternating layers of conductive interconnect wires 322a-322c and conductive vias 324a-324b. In some embodiments, thicknesses of the conductive interconnect wires 322a-322c increase as a distance from the substrate 110 increases. For example, a second interconnect wire 322b may have a first thickness $T_1$ that is smaller than a second thickness $T_2$ of a third interconnect wire 322c. Further, a first conductive interconnect wire 322a closest to the substrate 110 is electrically coupled to the pixel sensor 106 by a conductive contact 118. In various embodiments, the conductive contact 118, the conductive interconnect wires 322a-322c, and the conductive vias 324a-324b may comprise, for example, a metal, such as copper, titanium, chromium, niobium, lead, palladium, gold, silver, aluminum, tungsten, or some other conductive material.

A reflector 102 is also arranged within the interconnect structure 112. The reflector 102 vertically extends from within the first ESL 318a to within the ILD structure 312, so that the reflector 102 is laterally separated from the conductive contact 118 by the ILD structure 312. In some embodiments, the reflector 102 may contact the first ESL 318a along multiple surfaces. For example, the reflector 102 may have sidewalls that contact sidewalls of the first ESL 318a and a horizontally extending bottom surface, facing away from the substrate 110, which contacts the first ESL 318a. In some embodiments (not shown), the reflector 102 has a point closest to the substrate 110, which is separated from the first ILD layer 314 by the second ILD layer 316. In other embodiments, the reflector 102 extends through the second ILD layer 316 and into the first ILD layer 314. In some embodiments, a first horizontal line, which is parallel to the second surface 110b of the substrate 110 extends through the reflector 102 and the conductive contact 118. In some embodiments, a second horizontal line, which is parallel to the second surface 110b of the substrate 110 extends through the reflector 102 and the first conductive interconnect wire 322a.

In some embodiments, a support device 326 is affixed to the substrate 110 through the interconnect structure 112. The support device 326 may be, for example, a bulk substrate or an IC chip. In some embodiments, the IC chip is electrically coupled to the pixel sensor 106 through the interconnect structure 112. The IC chip may, for example, comprise an additional semiconductor substrate (not shown) and an additional interconnect structure (not shown) arranged over the additional semiconductor substrate.

A passivation layer 328 is arranged along a second surface 110b of the substrate 110. The passivation layer 328 comprises a well filled with a color filter 330 and covered by a micro-lens 332. The passivation layer 328 may be, for example, a multilayer stack of dielectric layers, such as, for example, a nitride layer stacked between a pair of oxide layers. The color filter 330 is configured to selectively transmit an assigned color or wavelengths of radiation to the pixel sensor 106, and the micro-lens 332 is configured to focus incident radiation onto the color filter 330 and/or the pixel sensor 106.

Figure 4:
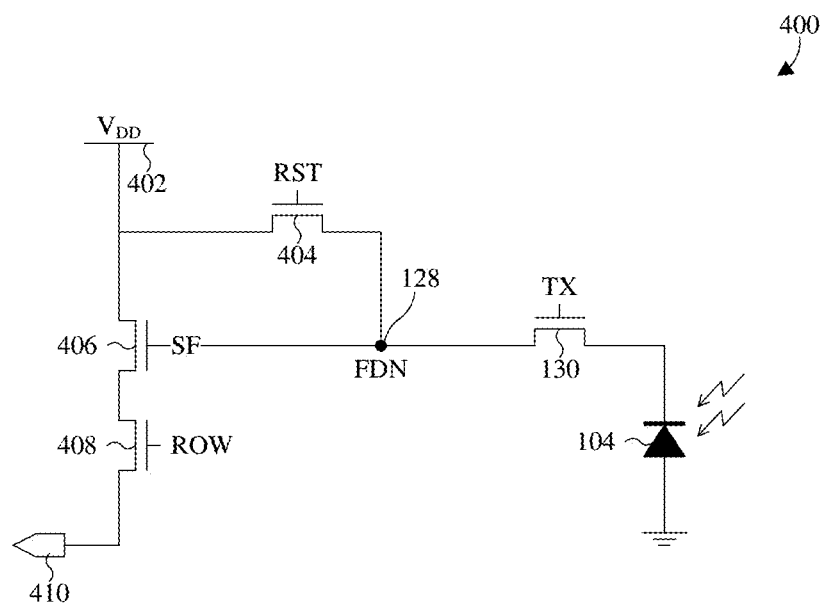
FIG. 4 illustrates a circuit diagram of some embodiments of a pixel sensor in the BSI image sensor.

With reference to FIG. 4, a circuit diagram 400 of some embodiments of the pixel sensor 106 in the BSI image sensor of FIG. 1 is provided. As illustrated, a FDN 128 is selectively coupled to a photodetector 104 by a transfer transistor 130, and is selectively coupled to a power source 402 by a reset transistor 404. The photodetector 104 may be, for example, a photodiode, and/or the power source 402 may be, for example, a direct current (DC) power source. The transfer transistor 130 is configured to transfer charge accumulated in the photodetector 104 to the FDN 128, and the reset transistor 404 is configured to clear charge stored at the FDN 128. The FDN 128 gates a source follower transistor 406 that selectively couples the power source 402 to a row select transistor 408, and the row select transistor 408 selectively couples the source follower transistor 406 to an output 410. The source follow transistor 406 is configured to non-destructively read and amplify charge stored in the FDN 128, and the row select transistor 408 is configured to select the pixel sensor 106 for readout.

While the pixel sensor 106 in the BSI image sensor of FIG. 1 is described as a five transistor (5T) APS within FIG. 4, it is to be appreciated that other embodiments of the pixel sensor 106 may include more or less transistors. For example, other embodiments of the pixel sensor 106 may include two, three, or six transistors.

Figure 5:
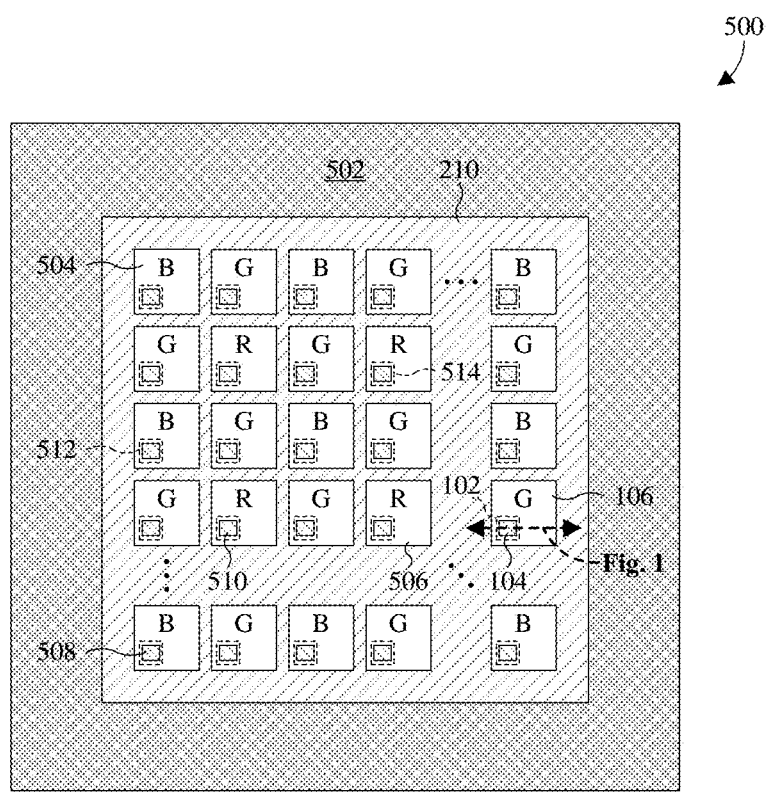
FIG. 5 illustrates a top view of some embodiments of the BSI image sensor of FIG. 1.

With reference to FIG. 5, a top view 500 of some embodiments of the BSI image sensor of FIG. 1 is provided. As illustrated, a logic region 502 of the BSI image sensor laterally surrounds an isolation region 210 within which an array of pixel sensors 106, 504, 506 are arranged. The logic region 502 comprises, for example, logic and/or memory devices (not shown) configured to read and/or store data generated by the pixel sensors 106, 504, 506 in response to incident radiation. The isolation region 210 is configured to isolate the pixel sensors 106, 504, 506 and is, for example, an STI region.

The pixel sensors 106, 504, 506 are assigned respective wavelengths of radiation. In some embodiments, the pixel sensors 106, 504, 506 are alternatingly assigned red wavelengths of radiation (e.g., about 620 to about 750 nanometers), green wavelengths of radiation (e.g., about 495 to about 570 nanometers), and blue wavelengths of radiation (e.g., about 450 to about 495 nanometers). For example, pixel sensors 506 labeled "R" are assigned red wavelengths of radiation, pixel sensors 504 labeled "B" are assigned blue wavelengths of radiation, and pixel sensors 106 labeled "G" are assigned green wavelengths of radiation. Further, in some embodiments, the pixel sensors 106, 504, 506 alternate between red, green, and blue wavelength assignments according to a Bayer filter mosaic.

The pixel sensors 106, 504, 506 are individually configured according to the pixel sensor 106 in FIG. 1, 2A-2D, or 3, and comprise individual color filters (not shown) configured to filter incident radiation according to the assigned wavelengths of radiation. For example, as seen in FIG. 3, a pixel sensor 106 comprises a color filter (330 of FIG. 3) arranged thereover. Further, the pixel sensors 106, 504, 506 comprise individual photodetectors 104, 508, 510 and individual reflectors 102, 512, 514 (shown in phantom) underlying the photodetectors 104, 508, 510.

In some embodiments, the reflectors 102, 512, 514 are different materials depending upon the assigned wavelengths of radiation for respective pixel sensors 106, 504, 506. The materials of the reflectors 102, 512, 514 may, for example, be selected to optimize reflectance of the assigned wavelengths of radiation. For example, reflectors 102 assigned green wavelengths of radiation may be a first material with a high reflectance for the green wavelengths (relative to blue and red wavelengths), reflectors 512 assigned blue wavelengths of radiation may be a second material with a high reflectance for the blue wavelengths (relative to green and red wavelengths), and reflectors 514 assigned red wavelengths of radiation may be a third material with a high reflectance for the red wavelengths (relative to green and blue wavelengths).

Further, in some embodiments, the reflectors 102, 512, 514 are laterally offset from respective ones of the photodetectors 104, 508, 510 in proportion to a distance from a center of the array and/or in a direction away from the center of the array. The lateral offsets may be, for example, with respect to edges and/or centers of the photodetectors 104, 508, 510 and the reflectors 102, 512, 514. In some embodiments, the centers of the photodetectors 104, 508, 510, the reflectors 102, 512, 514, and the array are centroids of respective footprints. A footprint is a two-dimensional projection onto a horizontal plane.

With reference to FIGS. 6-15, a series of cross-sectional views 600-1500 of some embodiments of a method for manufacturing a BSI image sensor with a reflector 102 is provided. Although the cross-sectional views 600-1500 shown in FIGS. 6-15 are described with reference to a method, it will be appreciated that the structures shown in FIGS. 6-15 are not limited to the method but rather may stand alone separate of the method.

Figure 6:
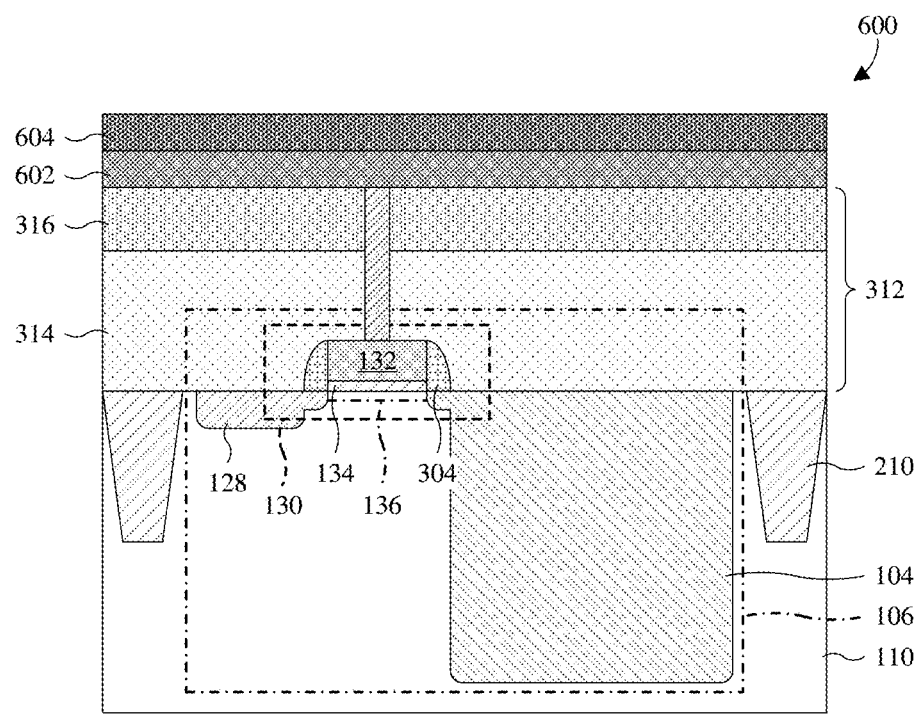
FIGS. 6-15 illustrate a series of cross-sectional views of various embodiments of a method for manufacturing a BSI image sensor with a reflector having a curved surface.

As illustrated by the cross-sectional view 600 of FIG. 6, a substrate 110 is provided. In various embodiments, the substrate 110 may be any type of semiconductor body (e.g., silicon, SiGe, SOI, etc.), as well as any other type of semiconductor, epitaxial, dielectric, or metal layers, associated therewith. A photodetector 104 (e.g., a photodiode) and a FDN 128 are formed within a pixel sensor 106 of the substrate 110 on opposing sides of a gate dielectric layer 134 and an overlying gate electrode 132 to form a transfer transistor 130. In some embodiments, the transfer transistor 130 comprises a sidewall spacer 304 lining sidewall surfaces of the gate electrode 132. One or more isolation region 210 extend into the substrate 110 on opposing sides of the pixel sensor 106.

An ILD structure 312 is formed over a first surface 110a of the substrate 110. In some embodiments, the ILD structure 312 may be formed by a vapor deposition process, such as chemical vapor deposition (CVD) process or physical vapor deposition (PVD) process, or grown by a thermal oxidation. In some embodiments, the ILD structure 312 may comprise a first ILD layer 314 comprising a borophosphosilicate glass (BPSG), a phosphor silicate glass (PSG), or the like. In some embodiments, the ILD structure 312 may further comprise a second ILD layer 316 contacting the first ILD layer 314. In some embodiments, the second ILD layer 316 may comprise an undoped silicate glass (USG).

A conductive contact 118 extends from an upper surface of the ILD structure 312 to the gate electrode 132 of the transfer transistor 130. The conductive contact 118 comprises a conductive material, such as, for example, copper, aluminum, tungsten, gold, or some other conductive material. In some embodiments, the conductive contact 118 may be formed by selectively etching the ILD structure 312 to form a contact hole and subsequently depositing a conductive material in to the contact hole. A planarization process (e.g., a chemical mechanical planarization process) may be performed after depositing the conductive material into the contact hole to remove excess conductive material from over the ILD structure 312.

A lower etch stop layer 602 is formed over the ILD structure 312 and the conductive contact 118. In some embodiments, the lower etch stop layer 602 may comprise a nitride (e.g., silicon nitride), a carbide (e.g., silicon carbide), or the like. In some embodiments, the lower etch stop layer 602 may be deposited by a vapor deposition process, such as chemical vapor deposition (CVD) process or physical vapor deposition (PVD) process.

A hard mask layer 604 is formed over the lower etch stop layer 602. In some embodiments, the hard mask layer 604 comprises a nitride (e.g., silicon oxynitride (SiON), titanium nitride (TiN), etc.), a carbide (e.g., silicon carbide), or the like. In some embodiments, the hard mask layer 604 may be deposited by a vapor deposition process, such as chemical vapor deposition (CVD) process or physical vapor deposition (PVD) process.

Figure 7:
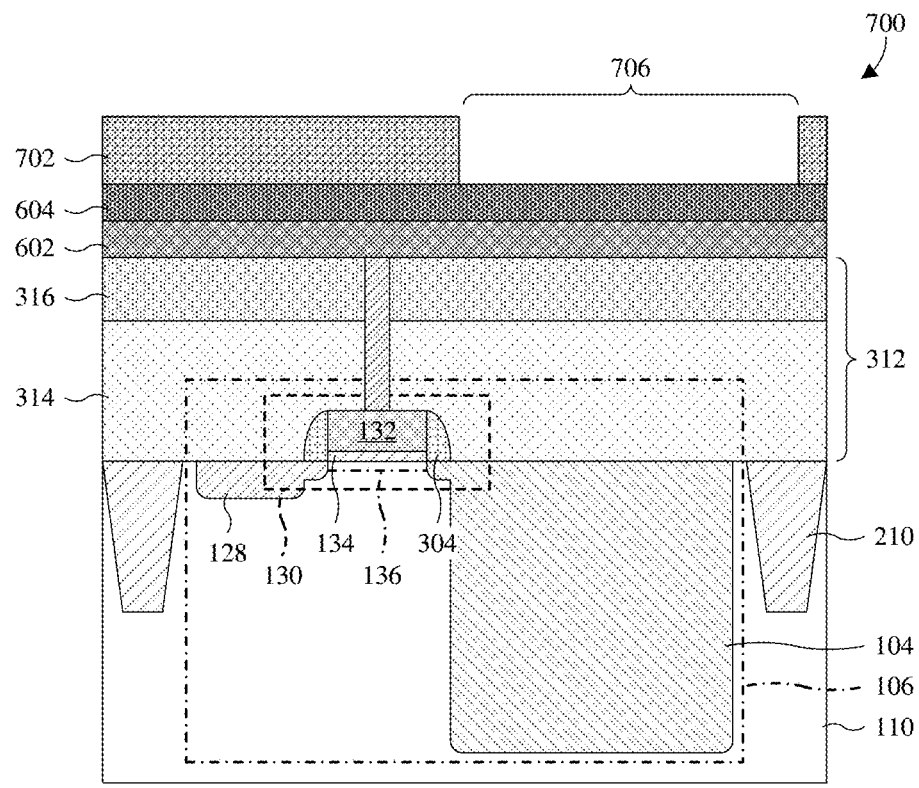

As illustrated by the cross-sectional view 700 of FIG. 7, a masking layer 702 is formed over the hard mask layer 604. The masking layer 702 may be formed by depositing a layer of photosensitive material (e.g., a positive or negative photoresist) over the hard mask layer 604. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define an openings 706 within the photosensitive material by removing the soluble regions.

Figure 8:
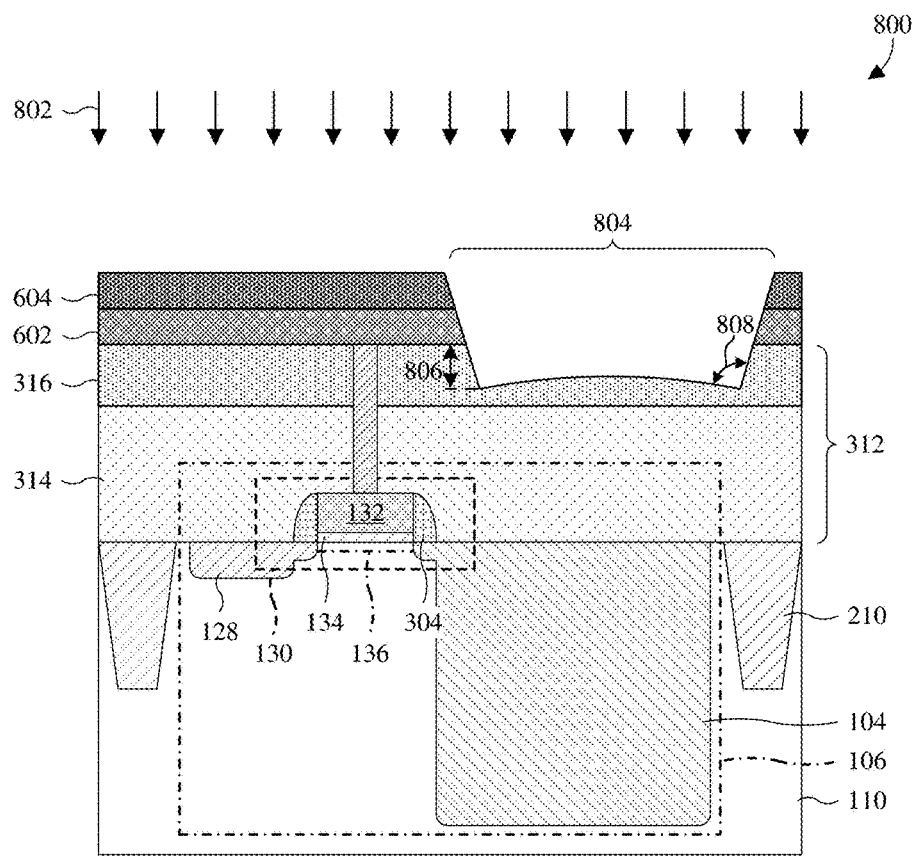

As illustrated by the cross-sectional view 800 of FIG. 8, a first etching process is performed on layers underlying the hard mask layer 604. The first etching process selectively exposes the layers underlying the hard mask layer 604 to one or more etchants 802 according to the hard mask layer 604. The first etching process forms a reflector recess 804 that extends through the lower etch stop layer 602 and into the ILD structure 312. In some embodiments, the first etching process may be configured to over etch the lower etch stop layer 602 by a non-zero distance 806 of between approximately 200-600 angstroms.

The first etching process is configured to form a reflector recess 804 that is defined by a horizontally extending non-planar lower surface that extends deeper within the ILD structure (i.e., closer to the substrate 110) along edges of the reflector recess 804 than at a center of the reflector recess 804. In some embodiments, the first etching process is configured to form a reflector recess 804 having a curved lower surface. In some embodiments (not shown), the first etching process is configured to form a reflector recess 804 having a lower surface with divots along outer edges of the lower surface. In some embodiments, the first etching process may result in the reflector recess 804 having sidewalls that are angled at an angle 808. The angle 808 may be in a range of between approximately 60° and approximately 80°

In some embodiments, the first etching process may comprise a microtrenching etch process (e.g., a dry etch process in which the ion to neutral radical flux is large compared to reactive-ion-etching), in which etch rates are larger at a base of sidewalls of the hard mask layer 604. The microtrenching etch process results in an etch profile across the lower surface of the reflector recess 804 that is convex and/or has divots (i.e., vertical protrusions) at the base of the sidewalls of the hard mask layer 604.

The microtrenching etch process may be performed using various etch chemistries. For example, in some embodiments, the microtrenching etch process may comprise a dry etching process with an etch chemistry comprising chlorine and argon. In other embodiments, the microtrenching etch process may comprise a dry etching process with an etch chemistry comprising a fluorine species (e.g., hexaflourine) and oxygen. In some embodiments, a taper of the lower surface of the reflector recess 804 may be selectively controlled based on a ratio of etching gases used in a dry etching process. For example, the taper of the lower surface may be based on a ratio of a first etching gas (e.g., oxygen) to second etching gas (e.g., a fluorine species).

Figure 9:
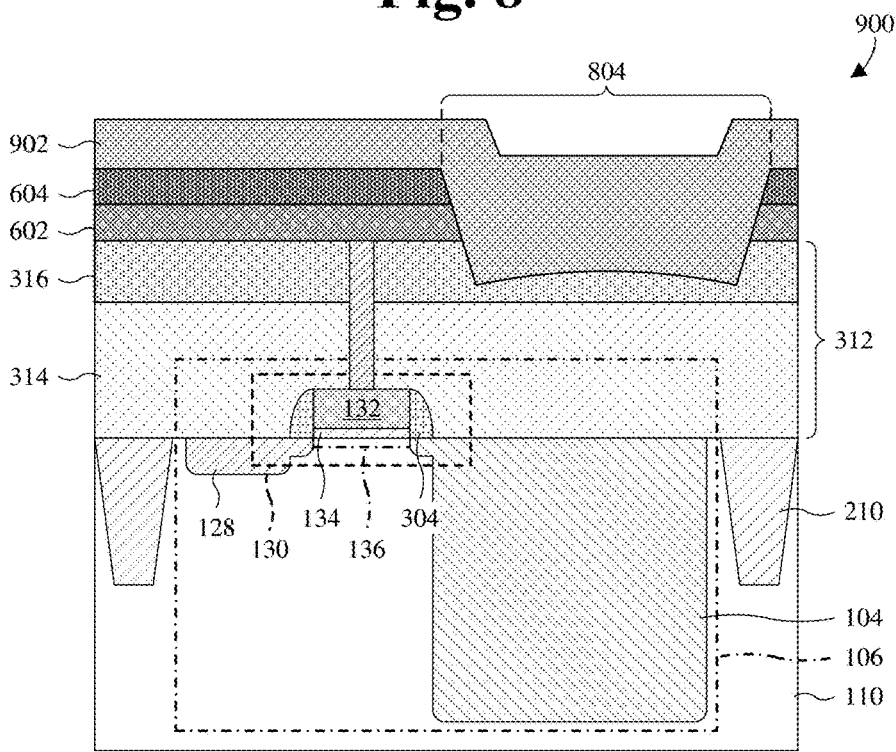

As illustrated by the cross-sectional view 900 of FIG. 9, a reflective material 902 is formed in the reflector recess 804. In some embodiments, the reflective material 902 comprises aluminum, silver, gold, aluminum copper, copper, and/or some other metal. Furthermore, in some embodiments, the process for forming the reflective material 902 comprises depositing or otherwise growing the reflective material 902 covering the lower etch stop layer 602 and over-filling the reflector recess 804.

Figure 10:
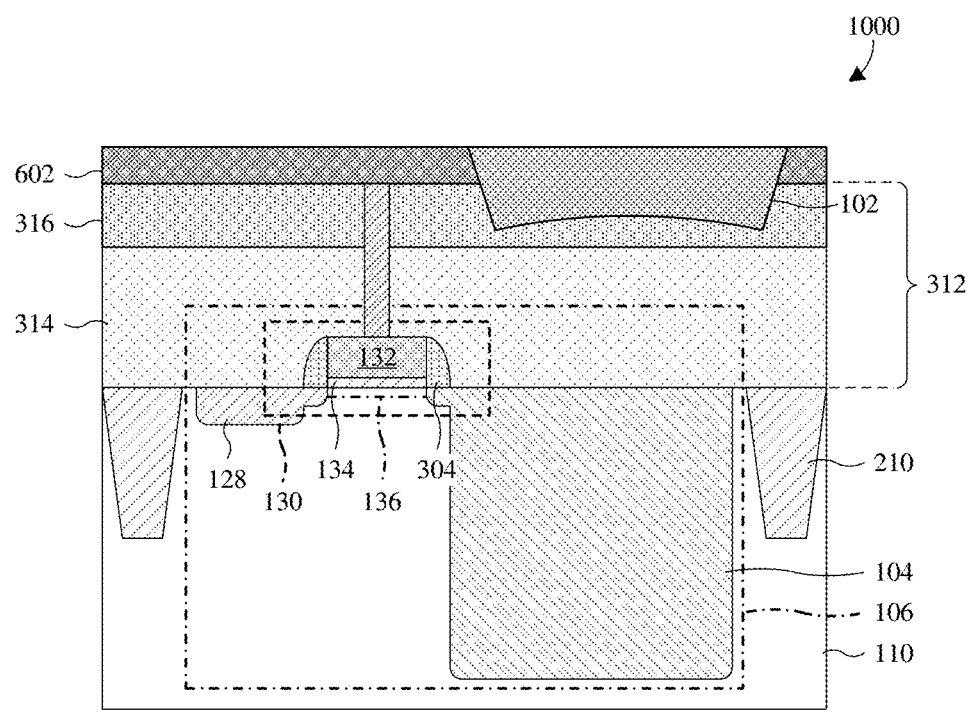

As illustrated by the cross-sectional view 1000 of FIG. 10, a planarization process is performed to form a reflector 102 by removing the reflective material 902 from over the lower etch stop layer 602. In some embodiments, the planarization process may comprise a chemical mechanical planarization (CMP) process. In other embodiments, the reflective material 902 over the hard mask layer (604 of FIG. 9) may be removed by an etch back process.

Figure 11:
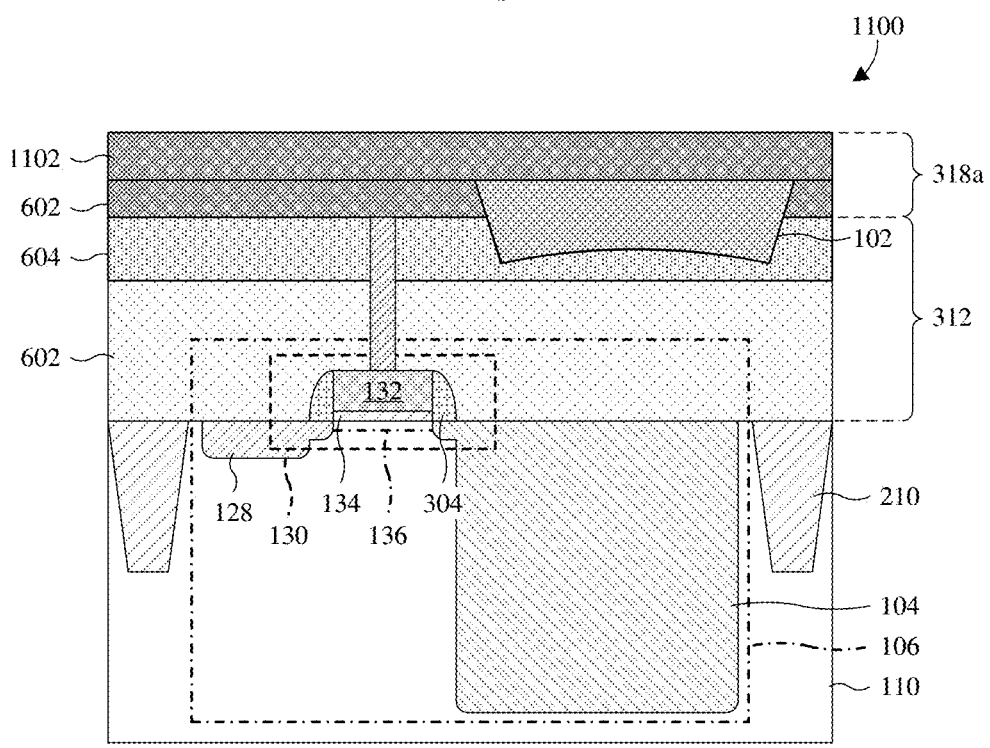

As illustrated by the cross-sectional view 1100 of FIG. 11, an upper etch stop layer 1102 is formed over the lower etch stop layer 602 and the reflector 102. The lower etch stop layer 602 and the upper etch stop layer 1102 may collectively comprise a first etch stop layer 318a. The upper etch stop layer 1102 may comprise a same material or a similar as the lower etch stop layer 602, and may be, for example, silicon carbide or silicon nitride.

Figure 12:
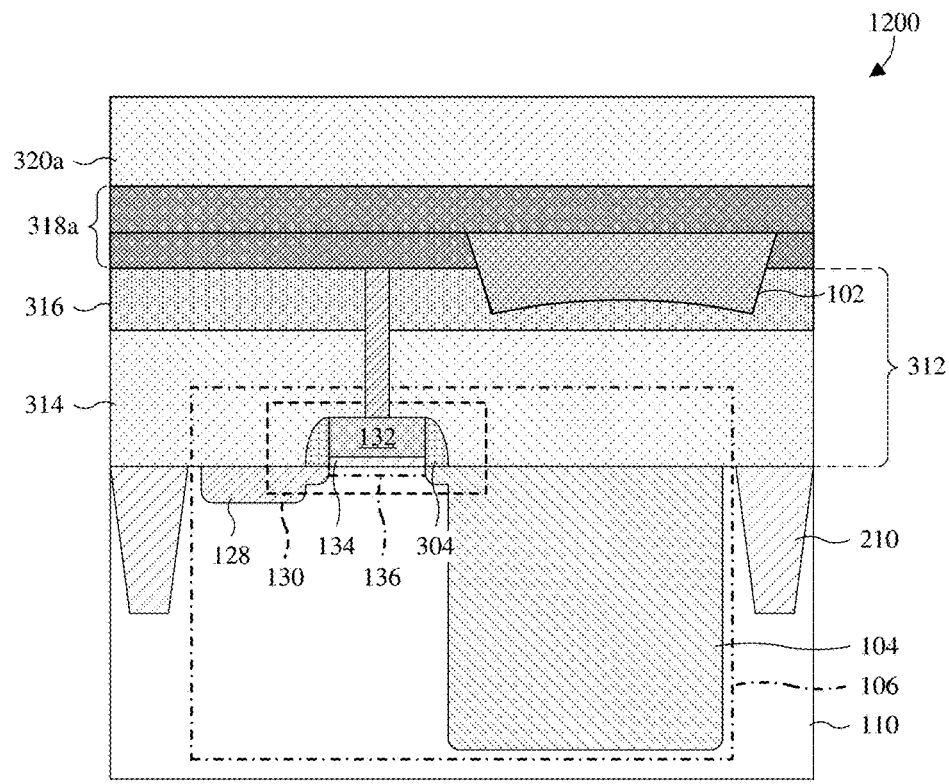

As illustrated by the cross-sectional view 1200 of FIG. 12, a first inter-metal dielectric (IMD) layer 320a is formed over the first etch stop layer 318a. The first IMD layer 320a may be for example a low-k dielectric (e.g., SiCO), silicon dioxide, PSG, or some other dielectric material.

Figure 13:
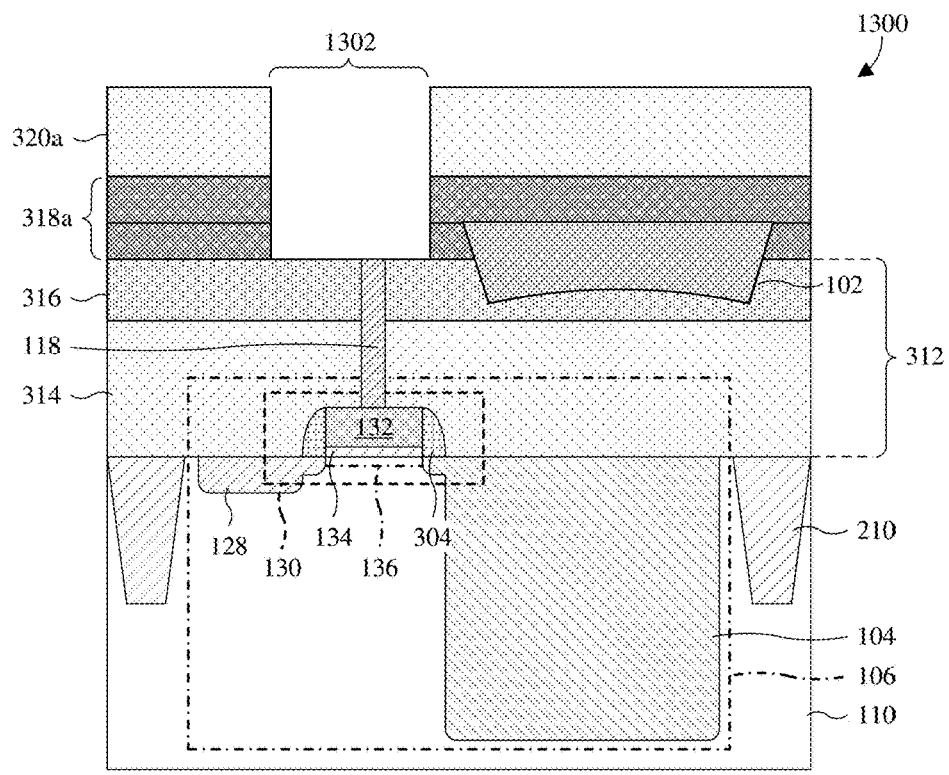

As illustrated by the cross-sectional view 1300 of FIG. 13, the first IMD layer 320a and the first etch stop layer 318a are selectively patterned to form a trench 1302 defining a location of a conductive interconnect wire. In some embodiments, first IMD layer 320a and the first etch stop layer 318a are selectively patterned according to a photolithography process.

Figure 14:
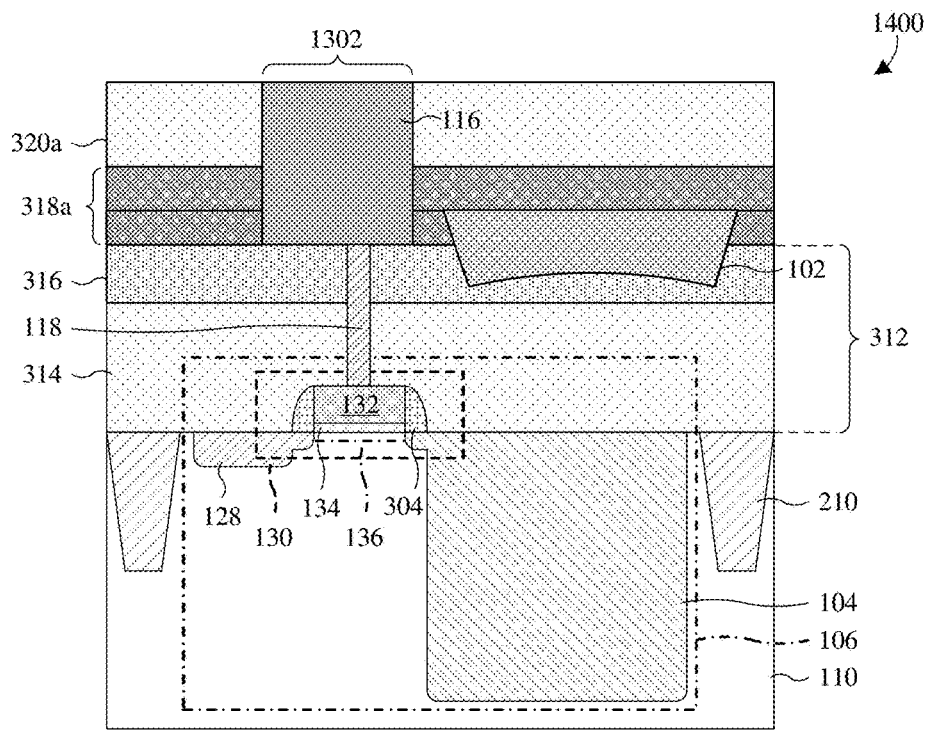

As illustrated by the cross-sectional view 1400 of FIG. 14, a conductive material is formed within the trench 1302 to form a conductive interconnect wire 116. In various embodiments, the conductive material may be formed by way of a deposition process and/or an electro plating process. For example, in some embodiments, a conductive seed layer may be formed within the trench 1302 followed by an electroplating process to fill the trench 1302 with the conductive material. In some embodiments, a barrier layer may be formed within the trench 1302 prior to the formation of the conductive material. In some embodiments, the conductive material may comprise copper and/or aluminum. In some embodiments, the barrier layer may comprise titanium nitride or tantalum nitride, for example. In some embodiments, the conductive interconnect wire 116 may be electrically coupled to the gate electrode 132 by the conductive contact 118.

Figure 15:
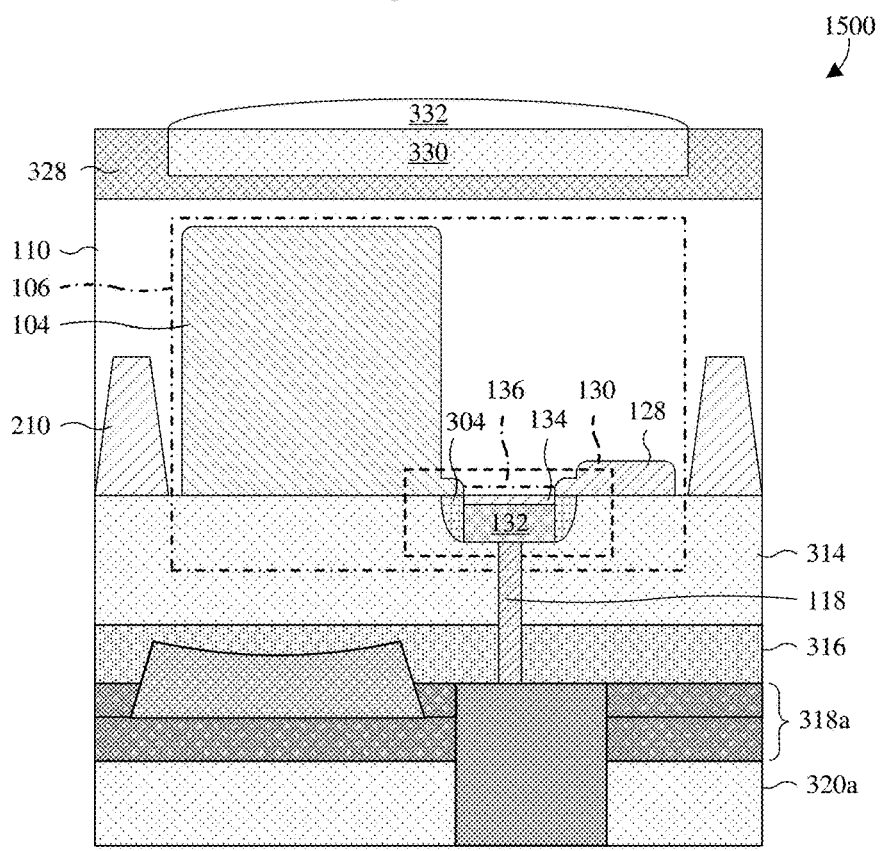

As illustrated by the cross-sectional view 1500 of FIG. 15, the semiconductor structure of FIG. 14 is rotated about 180 degrees and a passivation layer 328 is formed on the substrate 110. In some embodiments, the passivation layer 328 is formed of silicon nitride or silicon dioxide. Further, in some embodiments, the process for forming the passivation layer 328 comprises depositing or otherwise growing the passivation layer 328 by, for example, thermal oxidation or vapor deposition. Also illustrated by the cross-sectional view 1500 of FIG. 15, a color filter 330 is formed buried in the passivation layer 328, and a micro-lens 332 is formed covering the color filter 330.

Figure 16:
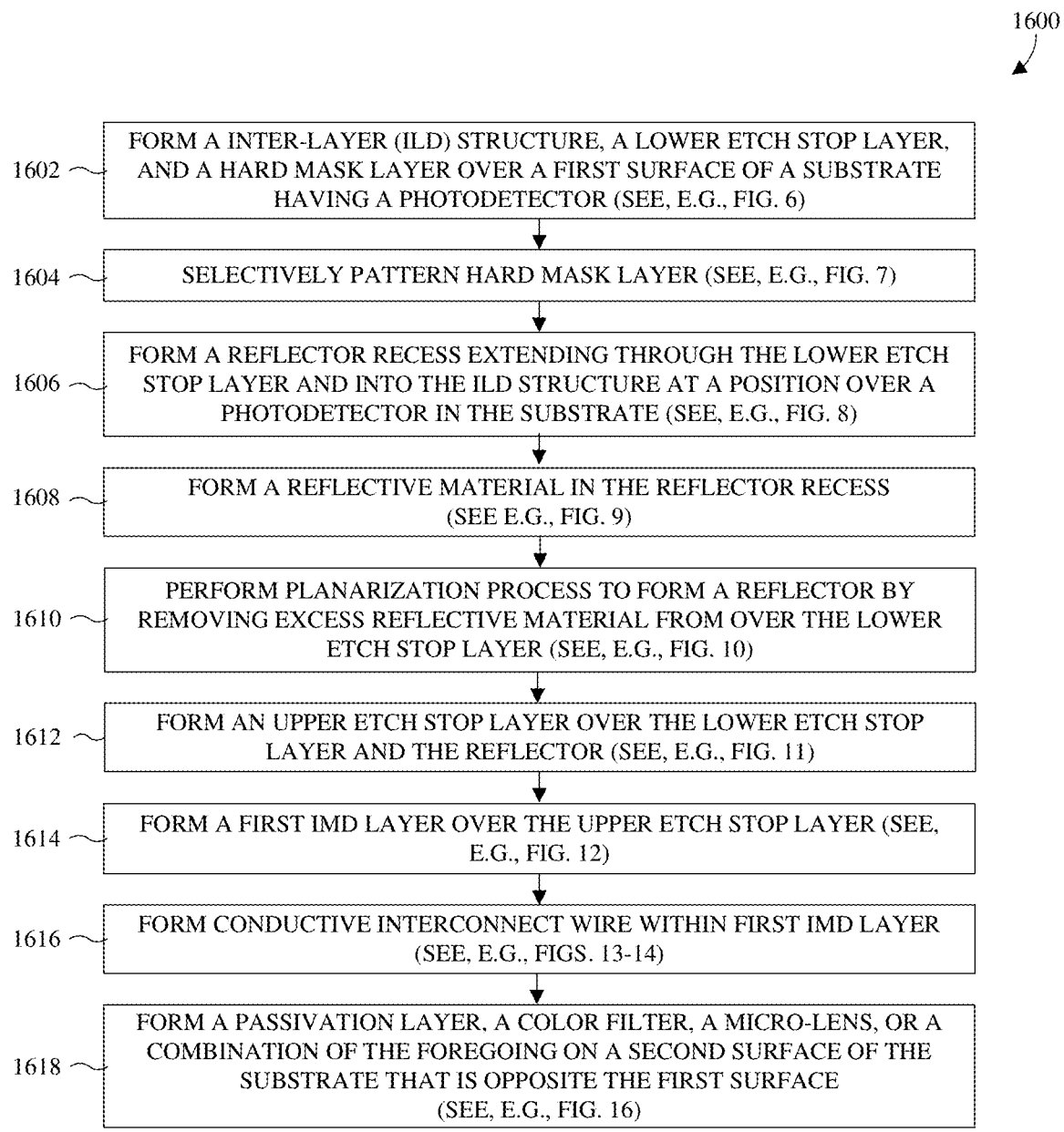
FIG. 16 illustrates a method for manufacturing a BSI image sensor with a reflector corresponding to FIGS. 6-15.

With reference to FIG. 16, a flowchart 1600 of some embodiments of a method for manufacturing a BSI image sensor with a reflector is provided.

While the method described by the flowcharts 1600 of FIG. 16 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1602, an ILD structure, a lower etch stop layer, and a hard mask layer are consecutively formed over a first surface of a substrate having a photodetector. FIG. 6 illustrates some embodiments of a cross-sectional view 600 corresponding to act 1602.

At 1604, the hard mask layer is selectively patterned. FIG. 7 illustrates some embodiments of a cross-sectional view 700 corresponding to act 1602.

At 1606, a reflector recess defined by a non-planar surface of the ILD structure is formed to extend through the lower etch stop layer and into the ILD structure at a position over a photodetector within the substrate. In some embodiments, the reflector recess may be formed using a microtrenching etch process. FIG. 8 illustrates some embodiments of a cross-sectional view 800 corresponding to act 1606.

At 1608, a reflective material is formed in the reflector recess and over the lower etch stop layer. FIG. 9 illustrates some embodiments of a cross-sectional view 900 corresponding to act 1608.

At 1610, a planarization process is performed to form a reflector by removing excess reflective material from over the lower etch stop layer. FIG. 10 illustrates some embodiments of a cross-sectional view 1000 corresponding to act 1610.

At 1612, an upper etch stop layer is formed over the lower etch stop layer and the reflector. FIG. 11 illustrates some embodiments of a cross-sectional view 1100 corresponding to act 1612.

At 1614, a first inter-metal dielectric (IMD) layer is formed over the upper etch stop layer. FIG. 12 illustrates some embodiments of a cross-sectional view 1300 corresponding to act 1614.

At 1616, a conductive interconnect wire is formed within the first IMD layer. FIGS. 13-14 illustrate some embodiments of cross-sectional views 1300-1400 corresponding to act 1616.

At 1618, a passivation layer, a color filter, a micro-lens, or a combination of the foregoing are formed on a second surface of the substrate that is opposite the first surface. FIG. 15 illustrates some embodiments of a cross-sectional view 1500 corresponding to act 1618.

Thus, as can be appreciated from above, in some embodiments, the present disclosure relates to a back-side illuminated complementary metal oxide semiconductor image sensor (BSI-CIS) having a curved reflector configured to provide for a high quantum efficiency and low crosstalk, and an associated method of formation.

In some embodiments, the present disclosure relates to an integrated chip. The integrated chip comprises an inter-layer dielectric (ILD) structure disposed along a first surface of a substrate having a photodetector, and an etch stop layer over the ILD structure. A reflector is surrounded by the etch stop layer and the ILD structure. The reflector has a curved surface facing the substrate at a location directly over the photodetector. The curved surface is coupled between a first sidewall and a second sidewall of the reflector. The reflector has larger thicknesses along the first sidewall and the second sidewall than at a center of the reflector between the first sidewall and the second sidewall In other embodiments, the present disclosure relates to a method for manufacturing an image sensor. The method comprises forming a photodetector within a substrate, forming a gate electrode over a first surface of the substrate, and forming an inter-layer dielectric (ILD) structure over the first surface of the substrate and the gate electrode. The method further comprises forming a reflector recess extending into the ILD structure. The reflector recess is defined by a horizontally extending non-planar lower surface of the ILD structure and sidewalls of the ILD structure. The method further comprises forming a reflective material in the reflector recess, and performing a planarization process to form a reflector by removing the reflective material from over an uppermost surface of the ILD structure.

In yet other embodiments, the present disclosure relates to an image sensor. The image sensor comprises a photodetector disposed within a substrate, and a plurality of conductive interconnect layers arranged within a dielectric structure disposed along a first surface of the substrate. A reflector is arranged directly over the photodetector and is separated from the substrate by the dielectric structure. A line perpendicular to the first surface of the substrate bisects the reflector. A thickness of the reflector increases between the line and outer sidewalls of the reflector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a substrate;
   a photodetector in the substrate;
   a first wire having a first wire surface facing away from the substrate;
   a contact via extending from the substrate to the first wire; and
   a reflector having a first reflector surface facing away from the substrate and further having a second reflector surface facing the photodetector, wherein the first reflector surface is closer to the substrate than the first wire surface, and wherein the second reflector surface is curved and spaced from the substrate.

2. The image sensor according to claim 1, wherein a thickness of the reflector increases continuously and laterally from a center of the reflector to a sidewall of the reflector.

3. The image sensor according to claim 1, wherein an edge of the first reflector surface directly contacts an edge of the second reflector surface at an interface, and wherein a thickness of the reflector decreases continuously and laterally from a center of the reflector to the interface.

4. The image sensor according to claim 1, wherein a center of the first reflector surface is closer to the substrate than an edge of the first reflector surface.

5. The image sensor according to claim 1, wherein a maximum thickness of the reflector is less than a maximum thickness of the first wire.

6. The image sensor according to claim 1, wherein the first reflector surface is level with the first wire.

7. The image sensor according to claim 1, further comprising:
   a transistor on the substrate and comprising a gate electrode, wherein an edge of the reflector closest to the substrate is level with the gate electrode and is spaced from the substrate.

8. An image sensor, comprising:
   a substrate;
   a photodetector in the substrate;
   a reflector having a reflector surface that is indented and that faces the photodetector;
   a first wire having a wire sidewall facing the reflector;
   an intermetal dielectric (IMD) layer on the wire sidewall; and
   an etch stop layer between the IMD layer and the substrate and on the wire sidewall, wherein the etch stop layer has a different material than the IMD layer and separates the reflector from the IMD layer.

9. The image sensor according to claim 8, wherein the etch stop layer and the IMD layer directly contact at an interface, and wherein the reflector has a second reflector surface facing away from the photodetector and closer to the substrate than the interface.

10. The image sensor according to claim 8, wherein the etch stop layer is at a first edge of the wire sidewall closest to the substrate, wherein the IMD layer is at a second edge of the wire sidewall farthest from the substrate, and wherein the IMD layer and the etch stop layer directly contact.

11. The image sensor according to claim 8, wherein the reflector has a reflector sidewall facing the wire sidewall, and wherein the etch stop layer is on the reflector sidewall, but the IMD layer is spaced from the reflector sidewall.

12. The image sensor according to claim 8, wherein the first wire and the etch stop layer respectively have a wire surface and an etch stop surface that face the substrate and that are even with each other.

13. The image sensor according to claim 8, further comprising:
    a plurality of wires and a plurality of vias grouped by distance from the substrate respectively into a plurality of wire levels and a plurality of via levels that are alternatingly stacked, wherein the plurality of wire levels comprises a first wire level that is closest to the substrate amongst the plurality of wire levels and that comprises the first wire.

14. An image sensor, comprising:
    a substrate;
    a photodetector disposed within the substrate;
    a first wire; and
    a reflector level with the first wire and having a non-planar reflective surface facing the photodetector;
    wherein a bottommost location of the reflector is vertically offset from a bottommost location of the first wire, and wherein a topmost location of the reflector is vertically offset from a topmost location of the first wire.

15. The image sensor according to claim 14, wherein the reflector is closer to the substrate than the first wire.

16. The image sensor according to claim 14, wherein a vertical separation between the bottommost location of the reflector and the topmost location of the reflector is less than a vertical separation between the bottommost location of the first wire and the topmost location of the first wire.

17. The image sensor according to claim 14, further comprising:
    a second reflector extending into the substrate at a boundary of the photodetector, wherein the reflector and the second reflector are conductive.

18. The image sensor according to claim 14, wherein the topmost location of the reflector is closer to the substrate than the bottommost location of the reflector, and wherein the bottommost location of the reflector is closer to the substrate than the bottommost location of the first wire.

19. The image sensor according to claim 14, further comprising:
    a plurality of wires grouped by distance from the substrate into a plurality of wire levels, wherein a first wire level is closest to the substrate amongst a remainder of the wire levels and includes the first wire.

20. The image sensor according to claim 14, further comprising:
a transistor bordering the photodetector, wherein the photodetector defines a source/drain region of the transistor.

* * * * *